United States Patent [19]

Milkovic

[11] 4,278,940
[45] Jul. 14, 1981

[54] MEANS FOR AUTOMATICALLY COMPENSATING DC MAGNETIZATION IN A TRANSFORMER

[75] Inventor: Miran Milkovic, Scotia, N.Y.

[73] Assignee: General Electric Company, Somersworth, N.H.

[21] Appl. No.: 33,078

[22] Filed: Apr. 25, 1979

[51] Int. Cl.³ .................... G01R 1/20; G01R 11/24
[52] U.S. Cl. ........................ 324/127; 323/357; 324/110
[58] Field of Search ............... 324/127, 110, 117 R, 324/117 H; 323/6, 94 H; 179/18 FA, 170 R

[56] References Cited

U.S. PATENT DOCUMENTS

| | | | |
|---|---|---|---|
| 3,089,999 | 5/1963 | Dortort | 324/127 |
| 3,323,056 | 5/1967 | Haley | 324/117 H |
| 3,665,125 | 5/1972 | Valbonesi | 179/170 R |
| 3,708,749 | 1/1973 | Bateman et al. | 324/127 |
| 3,921,069 | 11/1975 | Milkovic | 324/107 |
| 4,096,363 | 6/1978 | Earp | 323/6 |

Primary Examiner—Ernest F. Karlsen
Attorney, Agent, or Firm—Robert E. Brunson

[57] ABSTRACT

Apparatus for providing automatic compensation of direct current magnetization of a current transformer in an alternating current watthour meter utilizing a magnetic field sensor and electronic circuitry to keep the transformer operating in its linear region when a DC component is superimposed on an AC current being provided to the transformer.

3 Claims, 2 Drawing Figures

MEANS FOR AUTOMATICALLY COMPENSATING DC MAGNETIZATION IN A TRANSFORMER

BACKGROUND OF THE INVENTION

This invention relates to alternating current solid state watthour meters of the electronic type and more specifically to current transformers used in such type watthour meters.

Consumers of electricity who are anxious to lower their utility bills may resort to various techniques. One possible approach is to vary the electrical characteristics of the load connected to the electric utility. If, for example, a diode is placed in series with the load, a direct current component is superimposed on the alternating current flowing through the load. A direct current component can also be introduced by using an internal source of direct current such as a battery.

Where an alternating current flowing in a current transformer has a direct current component superimposed of the alternating current, a DC magnetizing current in the core of the transformer can result, which DC magnetizing current tends to build and saturate the core. When saturation occurs the alternating current component in the primary winding of the current transformer no longer induces a signal in the secondary winding which is proportional to the input AC component. Where a current transformer, saturated in this manner, is part of an electronic or solid state watthour meter, the meter is rendered ineffective for accurately measuring the power being consumed by the load.

An object of the present invention is to provide a compensating means for counteracting any direct current saturation of a current transformer in an electronic watthour meter.

Another object of the present invention is to provide a compensating means that permits the current transformer in a watthour meter to operate in the linear region in the presence of a DC magnetization current.

SUMMARY OF THE INVENTION

The apparatus of the present invention automatically compensates for any DC magnetization or saturation of a transformer in an electronic watthour meter which is caused by a DC component superimposed on an alternating current (AC) signal or voltage applied to the transformer. The apparatus comprises a magnetic field or flux sensor means independent of the transformer for sensing a flux proportional to the current that flows in the primary or input winding of the transformer. The output of the flux sensor means is a signal which is proportional to the current in the primary winding of the transformer. This signal is then averaged to generate a signal of sufficient current magnitude to energize a compensating winding on the transformer, such that the DC magnetizing or saturating component of the current in the primary winding is counteracted to thereby provide an output signal from the transformer output or secondary winding which is proportional to the magnitude of the alternating current applied to the transformer primary. The output winding of the current transformer can be connected to the input circuitry of an electronic watthour meter to provide an accurate representation or measurement of the AC signal or current flowing through the primary.

DESCRIPTION OF THE DRAWING

While the specification concludes with claims particularly pointing out and distinctly claiming the present invention, the objects and advantages of the invention can be more readily ascertained from the following description of a preferred embodiment when read in conjunction with the accompanying drawing in which:

DESCRIPTION OF THE PREFERRED EMBODIMENT

Figure 1:
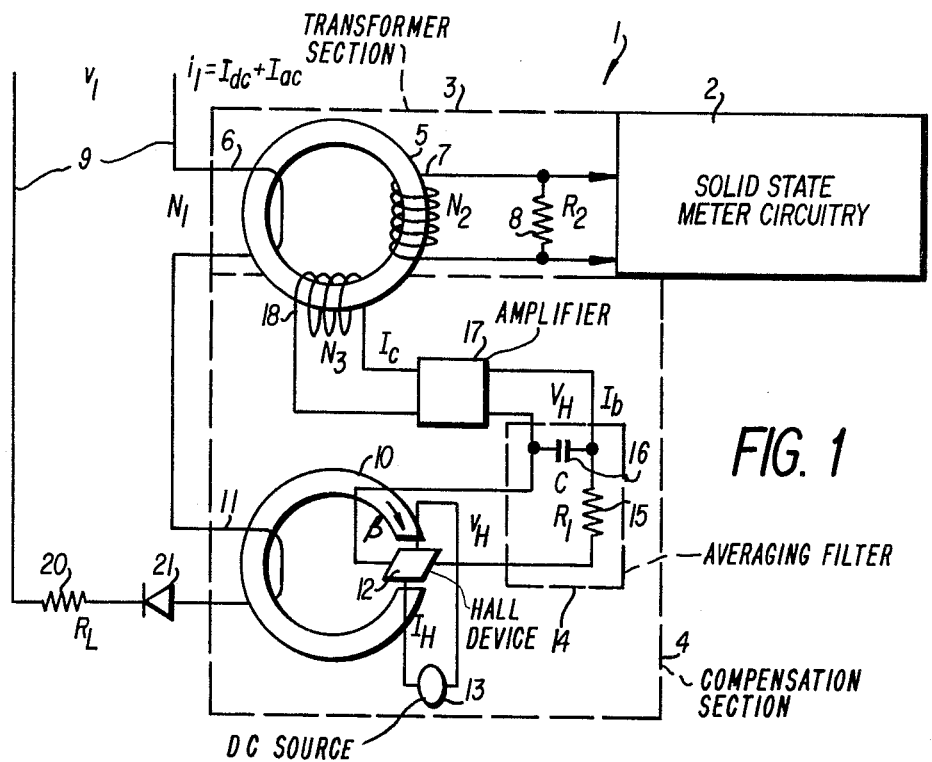
FIG. 1 is a schematic illustration of a solid state watthour meter incorporating a current transformer with automatic compensation of the DC magnetization in accordance with an embodiment of the present invention.

Referring now to FIG. 1, the present invention is incorporated in an electronic AC watthour meter, such as a solid state meter, indicated generally by the numeral 1 and which comprises a voltage sensing means, not shown, solid state meter circuitry 2, a current transformer section 3, and an automatic compensation section 4.

The meter circuitry 2 can be of the conventional electronic type found in the prior art, or more preferably of the solid state type hereinafter discussed in detail.

The transformer section 3 comprises a current transformer 5 having an input or primary winding 6, and an output or secondary winding 7. The output winding 7 has a resistor 8 connected across it and provides an input to the solid state watthour meter circuitry 2.

The automatic compensation section 4 comprises a sensing means shown as a flux concentrator 10 having a winding 11. The flux concentrator 10 has an air gap into which a Guass effect or flux sensor shown as a Hall device 12 is positioned. A direct current $I_H$, generated by a source 13, flows through the sensor 12. The output signal voltage ($v_H$) of the Hall sensor 12 is connected to a circuit means shown as an averaging filter 14. Filter 14 has a series resistor 15 and a parallel capacitor 16 connected to receive the signal voltage $V_{(H)}$ from the sensor 12. The output from the averaging filter 14 is amplified by a conventional amplifier 17 to provide a current ($I_c$) to a compensating winding 18 on transformer 5.

The input winding 6 of the current transformer 5 and the winding 11 of the flux concentrator 10 are both connected in series with the series connection of a load 20 and a diode 21 to receive an input voltage waveform $v_1$ on AC conductors 9 from an alternating current generating source not shown.

As can be seen in FIG. 1, the diode 21 will cause halfwave rectification of the input current waveform. This diode 21, or any other element which causes the current waveform in the input winding 7 to have a DC component superimposed on the AC component is an undesired addition to the load 20. The diode 21 is an example of a component which if introduced by the consumer would cause the meter to indicate less than the actual power used. When a diode 21 is added in series with the load 20, or if other means cause a DC component to be added to the input current ($i_1$) which will saturate transformer 5, the solid state watthour meter must be provided with compensating means to prevent such saturation.

In the present invention, this saturation is prevented by the Guass effect sensor shown as a Hall generator 12 in a gap of the flux concentrator 10. The flux concentrator 10 has the same current flowing through its winding 11, as flows through the primary winding 6 of the transformer 5, and thus the Hall generator 12, independently of the transformer 5, senses a flux proportional to the current flowing in the primary winding of the transformer 5.

It is well known that the Hall effect can be used as a magnetic field sensor. In the presently disclosed invention a DC current $I_H$ flows through the Hall sensor 12, as supplied by the source 13. A magnetic field B in the flux concentrator 10, results from the current flowing in winding 11, with the field extending perpendicular to the plane in which the Hall sensor 12 lies. The output voltage $v_H$ from the Hall sensor is proportional to the product of $B \times I_H$. The magnetic field B in the flux concentrator 10 is proportional to the current flowing in winding 11 of the flux concentrator, which in turn is proportional to the current in the primary winding of the current transformer 5. If $I_H$ is held constant, the output $v_H$ of the Hall sensor 12 is directly proportional to the current $i_1$ flowing in the primary of the current transformer 5.

The signal $v_H$, which is proportional to the current $i_1$, is averaged over one or more cycles of the input voltage ($v_1$) or current ($i_1$) by the averaging or low pass filter 14. The averaging filter 14 removes the alternating current component. At the output of the averaging filter there is established a signal $V_H$ which is proportional to the DC current component of the current in the input winding 6. The output voltage $V_H$ of the averaging filter 14 is converted into a current $I_c$ by means of the amplifier 17. As the DC component of the current in the input winding 6 increases, as would happen when diode 21 causes clipping of the current waveform or if a DC component is added by some other means, the output $V_H$ becomes larger. Thus, the circuit automatically compensates for differing values of the superimposed DC component. The gain of amplifier 17 is preliminarily adjusted to provide a gain sufficient to provide the compensating current $I_c$ in the winding 18 to create a flux sufficient to counteract the flux created by the DC component of the current in the input winding 6 of the current transformer 5 and thereby avoid such saturation.

The mathematical relationship between the compensation current $I_c$ and the DC component $I_{DC}$ is given by the transformer equation $I_{DC} N_I = I_c N_c$, where the total current flowing in the input winding $i_1 = I_{DC} + I_{AC} \cdot N_1$ and $N_c$ are the number of turns of winding 6 and 7 of transformer 5, respectively. Solving the transformer equation for $I_c$, one obtains $I_c = I_{DC} N_1 / N_c$. This is the value of $I_c$ need to achieve zero DC flux in current transformer 5.

Figure 2:
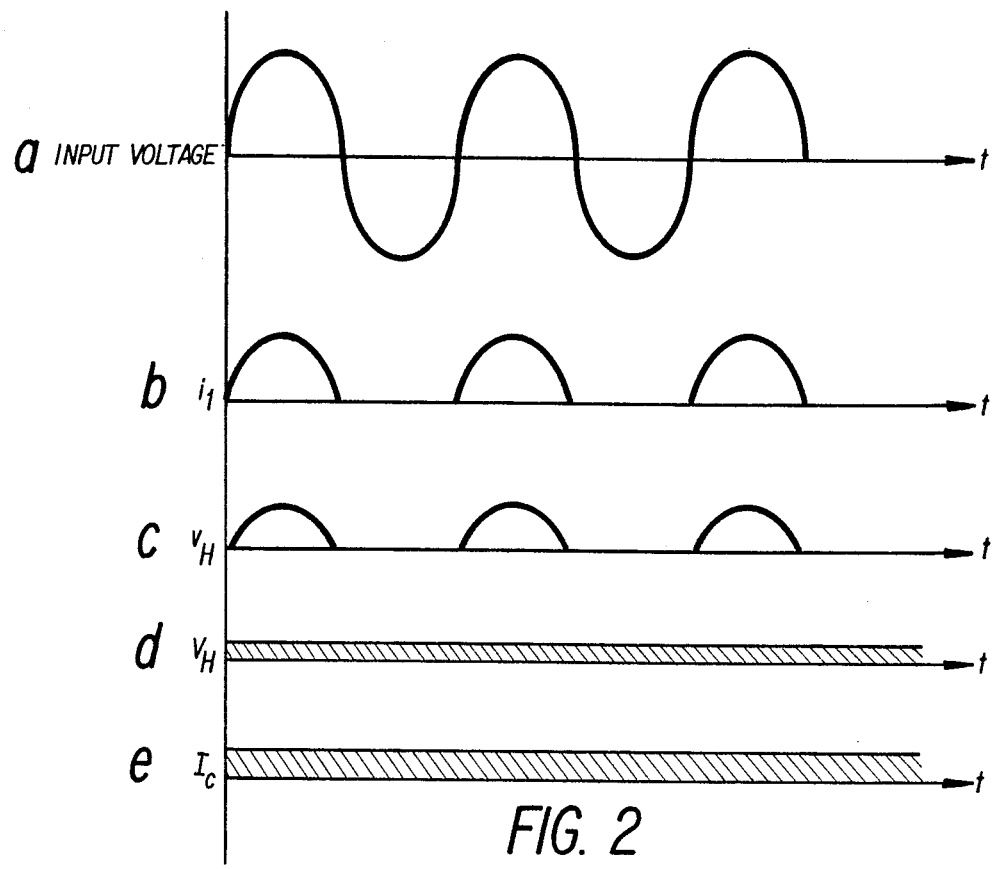
FIGS. 2a-2e is a waveform diagram illustrating various currents and voltages at various points in the operation of the arrangement illustrated in FIG. 1.

Reference is now made to FIGS. 2a–2e, wherein FIG. 2a shows the input voltage waveform $v_1$ to the load 20 and diode 21. The input voltage waveform does not have a DC component because the voltage is applied to both the diode 21 and the load 20. FIG. 2b shows the current $i_1$ which is the input current in winding 6 of current transformer 5 and also the current flowing in winding 11 of flux concentrator 10.

FIG. 2c shows the waveform for $v_H$ which is the output of the Hall sensor and which is proportional to $i_1$. FIG. 2d shows the output voltage $V_H$ of the averaging filter 14 which is proportional to the DC component of the primary current $i_1$. FIG. 2e shows the compensating current $I_c$ from the amplifier 17 which counteracts the DC component causing saturation of the core of the current transformer 5.

The current transformer section 3, together with the automatic compensation section 4, can be used in place of any current transformer with active or passive termination of the secondary. For example, in the electronic meter disclosed in U.S. Pat. No. 3,955,138, the current transformer could be removed and the current transformer 5 with the automatic compensation and resistor 8 in position could be substituted across terminals 28 and 30 of the meter shown in FIG. 1 of that patent. In U.S. Pat. No. 3,815,013, the current transformer 22 of FIG. 1 of that patent could be replaced by the presently disclosed current transformer 5 to provide automatic compensation. In this case, resistor 8 would not be used across the secondary winding 7. In other words and for purposes of further illustrating the adaptability of the present invention, the solid state circuitry sections of the meters disclosed in either of U.S. Pat. Nos. 3,955,138 and 3,815,013 could be used as Section 2 in the embodiment of the present invention illustrated in FIG. 1 of this specification. U.S. Pat. Nos. 3,955,138 and 3,815,013 are assigned to the same assignee as the present invention.

The core of the current transformer 5 can be of any ferromagnetic material and can be of the amorphous core type.

Although a Hall sensor is used as a magnetic field sensor in the presently disclosed invention, any suitable type of magnetic field or Gauss effect sensor such as, for example, a magneto-resistor can be effectively used therein.

While the present invention has been described with reference to a specific embodiment thereof, the foregoing will suggest other embodiments and modifications which are possible without departing from the invention. Accordingly, it is desired to cover all embodiments and modifications within the spirit and scope of this invention.

What is claimed as new and desired to be secured by Letters Patent of the United States is:

1. In an electronic watthour meter of the type having a transformer including an input winding for receiving alternating current from a power signal generating source, an output winding connected to meter circuitry for monitoring the alternating current flowing through the input winding, and a core which is potentially saturable through DC magnetization caused by an undersired DC component, of potentially differing values, which is deliberately superimposed on the AC component of the alternating current applied to the input winding of said transformer, apparatus for compensating for DC magnetization of said core comprising:

(a) a compensating winding on the core of said transformer;

(b) sensing means connected to sense the current flowing through the input winding of said transformer and generating an alternating output signal having a magnitude proportional to the sensed current and which includes the AC and DC components of sensed current; and (c) an averaging filter, including an amplifier, for filtering the AC component out of the alternating output signal over at least one cycle of the sensed current, to thereby provide, from said amplifier to said compensating winding of said transformer, a compensating current signal having a magnitude proportional to that value of the DC component of the sensed current, said compensating current signal effecting linear operation of said transformer by compensating for the DC magnetization of said core caused by the undesired DC component flowing in the input winding of said transformer to thereby effect maximum coupling of the AC component of the alternating current from the input winding to the output winding of said transformer to derive an input signal to the meter circuitry having a magnitude proportional to the magnitude of the alternating current flowing in the input winding of said transformer.

2. The apparatus of claim 1, wherein said sensing means comprises a flux concentrator having an air gap, a winding on said flux concentrator through which flows the same current flowing through said input winding and a magnetic field sensor located in said air gap for detecting the flux therein.

3. The apparatus of claim 2, wherein said magnetic field sensor comprises a Hall generator.

* * * * *